(12) United States Patent
Chang

(10) Patent No.: US 10,789,999 B1
(45) Date of Patent: Sep. 29, 2020

(54) SPREAD SPECTRUM CLOCK GENERATOR, MEMORY STORAGE DEVICE AND SIGNAL GENERATION METHOD

(71) Applicant: PHISON ELECTRONICS CORP., Miaoli (TW)

(72) Inventor: Chih-Kai Chang, Taoyuan (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/590,341

(22) Filed: Oct. 1, 2019

(30) Foreign Application Priority Data

Sep. 6, 2019 (TW) .............................. 108132225 A

(51) Int. Cl.
*G11C 7/22* (2006.01)

(52) U.S. Cl.
CPC ..................................... *G11C 7/222* (2013.01)

(58) Field of Classification Search
None
See application file for complete search history.

(56) References Cited

U.S. PATENT DOCUMENTS

| | | | | |
|---|---|---|---|---|
| 6,240,123 B1* | 5/2001 | Zhang | ..................... | H04B 15/04 375/130 |
| 6,326,859 B1* | 12/2001 | Goldman | ............... | H03K 3/011 331/111 |
| 7,504,897 B2* | 3/2009 | Chava | ..................... | H03K 4/502 327/156 |
| 8,320,428 B1* | 11/2012 | Hattori | ................... | H04B 15/02 375/130 |
| 8,558,497 B2* | 10/2013 | Wright | ..................... | H03K 7/08 318/599 |
| 9,628,057 B2* | 4/2017 | Shuvalov | ............. | H03K 3/0231 |
| 10,164,529 B2* | 12/2018 | Joos | ......................... | H04B 1/69 |
| 10,306,105 B2* | 5/2019 | Shumiya | ............... | H04N 1/4005 |

* cited by examiner

*Primary Examiner* — Jeffery S Zweizig
(74) *Attorney, Agent, or Firm* — JCIPRNET

(57) ABSTRACT

A spread spectrum clock generator including a clock generation circuit, an impedance component and a control circuit is provided. The impedance component is coupled to an impedance terminal of the clock generation circuit. The control circuit is configured to provide a control signal to the impedance component to generate a first voltage at the impedance terminal. The clock generation circuit is configured to generate a spread spectrum clock signal at an oscillation terminal of the clock generation circuit according to the first voltage. Furthermore, a memory storage device and a signal generation method are also provided.

30 Claims, 5 Drawing Sheets

SPREAD SPECTRUM CLOCK GENERATOR, MEMORY STORAGE DEVICE AND SIGNAL GENERATION METHOD

CROSS-REFERENCE TO RELATED APPLICATION

This application claims the priority benefit of Taiwan application serial no. 108132225, filed on Sep. 6, 2019. The entirety of the above-mentioned patent application is hereby incorporated by reference herein and made a part of this specification.

BACKGROUND

1. Technology Field

The invention relates to a signal processing technology, and more particularly, relates to a spread spectrum clock generator, a memory storage device and a signal generation method.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Spread spectrum (SS) clock has characteristics such as low electromagnetic interference (EMI). Therefore, the spread spectrum clock can be applied to electronic devices such as a memory storage device. Conventional spread spectrum generators have a built-in or external phase-locked loops (PLL) circuit to generate a spread spectrum clock signal by performing a spread spectrum operation on a clock signal through a specific circuit (e.g., a frequency divider) in the phase-locked loops circuit. However, as the size of the electronic device is further reduced, the spread spectrum clock generator of the built-in or external phase-locked loops circuit is more space-consuming in circuit layout and has more complicated circuit design.

SUMMARY

The invention provides a spread spectrum clock generator, a memory storage device and a signal generation method that can simplify design of the spread spectrum clock generator and improve performance of the spread spectrum clock generator.

An exemplary embodiment of the invention provides a spread spectrum clock generator, which includes a clock generation circuit, an impedance component and a control circuit. The impedance component is coupled to an impedance terminal of the clock generation circuit. The control circuit is coupled to the impedance component. The control circuit is configured to provide a control signal to the impedance component to generate a first voltage at the impedance terminal. The clock generation circuit is configured to generate a spread spectrum clock signal at an oscillation terminal of the clock generation circuit according to the first voltage.

An exemplary embodiment of the invention further provides a memory storage device, which includes a connection interface unit, a rewritable non-volatile memory module and a memory control circuit unit. The connection interface unit is configured to couple to a host system. The memory control circuit unit is coupled to the connection interface unit and the rewritable non-volatile memory module. The memory control circuit unit includes a spread spectrum clock generator. The spread spectrum clock generator is configured to provide a control signal to an impedance component to generate a first voltage at an impedance terminal of the spread spectrum clock generator. The impedance component is coupled to the impedance terminal. The spread spectrum clock generator is further configured to generate a spread spectrum clock signal at an oscillation terminal of the spread spectrum clock generator according to the first voltage.

An exemplary embodiment of the invention further provides a signal generation method for a memory storage device. The signal generation method includes: providing a control signal to an impedance component to generate a first voltage at an impedance terminal of a spread spectrum clock generator in the memory storage device, wherein the impedance component is coupled to the impedance terminal; and generating a spread spectrum clock signal at an oscillation terminal of the spread spectrum clock generator according to the first voltage.

Based on the above, the spread spectrum clock generator includes one impedance component that is coupled to the impedance terminal of the spread spectrum clock generator. After the control signal is received from the control circuit, the impedance component can generate the first voltage at the impedance terminal of the spread spectrum clock generator. The clock generation circuit may generate the spread spectrum clock signal at the oscillation terminal according to the first voltage.

To make the aforementioned more comprehensible, several embodiments accompanied with drawings are described in detail as follows.

DESCRIPTION OF THE EMBODIMENTS

Embodiments are provided below to describe the present disclosure in detail, though the present disclosure is not limited to the provided embodiments, and the provided embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

Figure 1:
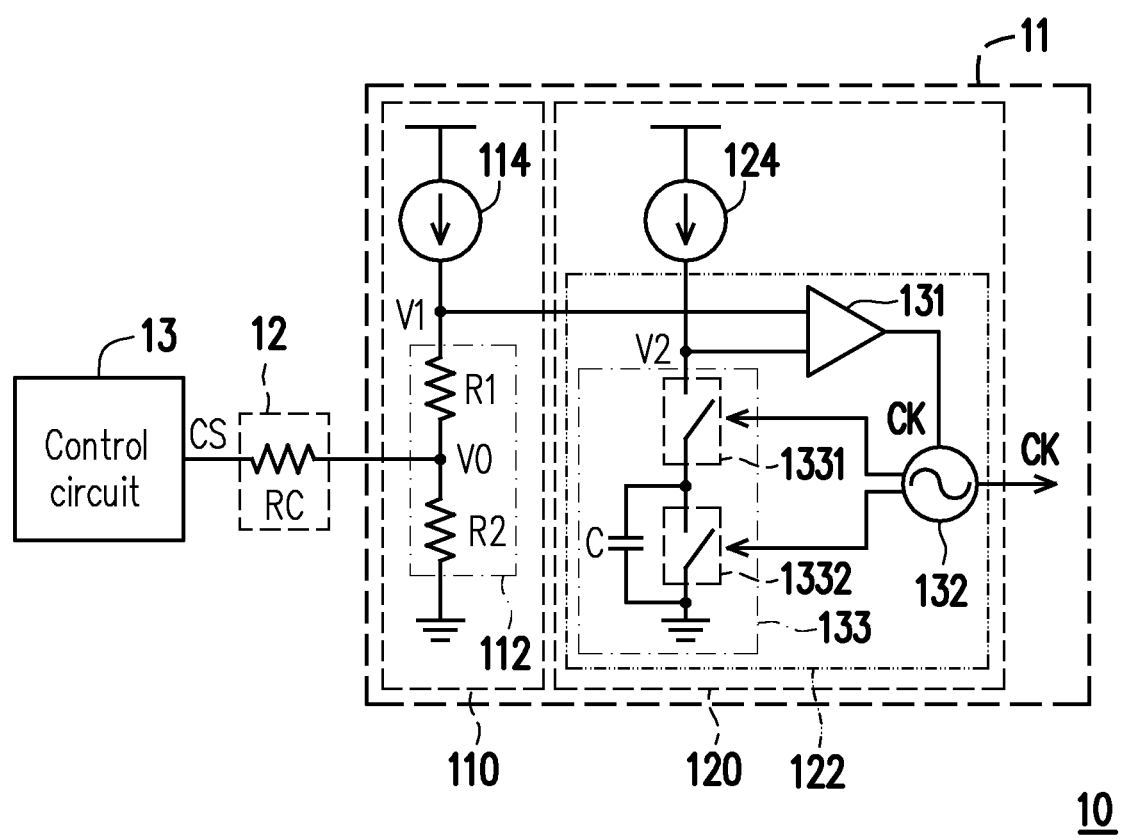
FIG. 1 is a schematic diagram illustrating a spread spectrum clock generator according to an exemplary embodiment of the invention.

FIG. 1 is a schematic diagram illustrating a spread spectrum clock generator according to an exemplary embodiment of the invention. Referring to FIG. 1, a spread spectrum clock generator 10 may be used to generate a spread spectrum clock signal CK. For example, a frequency of the spread spectrum clock signal CK may continuously change over time. The spread spectrum clock generator 10 may be disposed in a memory storage device or other type of electronic device.

The spread spectrum clock generator includes a clock generation circuit 11, an impedance component 12 and a control circuit 13. The impedance component 12 is coupled between the control circuit 13 and the clock generation circuit 11. More specifically, the clock generation circuit 11 includes an impedance terminal 110 and an oscillation terminal 120. The impedance component 12 is (directly) coupled to the impedance terminal 110 of the clock generation circuit 11. For example, the impedance component 12 may include one or more resistor components RC (and/or reactive components) to provide an impedance value. The control circuit 13 may provide a control signal CS to the impedance component 12 to generate a voltage (a.k.a. a first voltage) V1 at the impedance terminal 110. The clock generation circuit 11 may generate the spread spectrum clock signal CK at the oscillation terminal 120 according to the voltage V1.

In an exemplary embodiment, the spread spectrum clock generator 10 may exclude a phase-locked loops (PLL) circuit. Therefore, the output spread spectrum clock signal CK may be processed without going through the PLL circuit or the like correction circuit in the spread spectrum clock generator 10. Compared with the conventional spread spectrum clock generator including the PLL circuit, in an exemplary embodiment, the spread spectrum clock generator 10 excluding the PLL circuit is less space-consuming in circuit layout and has less complicated circuit design and/or lower power consumption during operation.

In an exemplary embodiment, the control signal CS is an oscillating signal or a periodic signal such as a triangular wave or a sine wave. In an exemplary embodiment, a voltage value of the control signal CS may affect a frequency variation amount of the spread spectrum clock signal CK. For example, at different time points, the frequency variation amount of the spread spectrum clock signal CK may be different, so that the spread spectrum clock signal CK may have different frequencies.

In an exemplary embodiment, an impedance value of the impedance component 12 may affect a frequency variation range of the spread spectrum clock signal CK. That is, the frequency of the spread spectrum clock signal CK may be varied within one preset frequency variation range.

Figure 2:
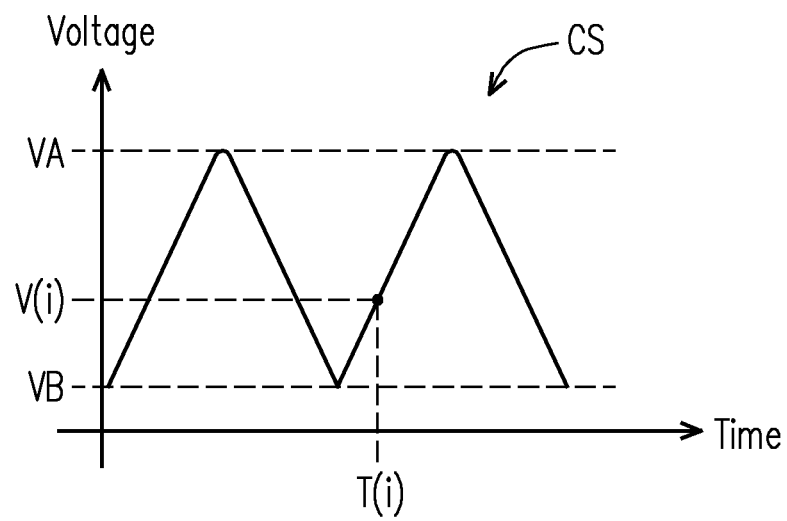
FIG. 2 is a schematic diagram illustrating a waveform of a control signal according to an exemplary embodiment of the invention.
Figure 3:
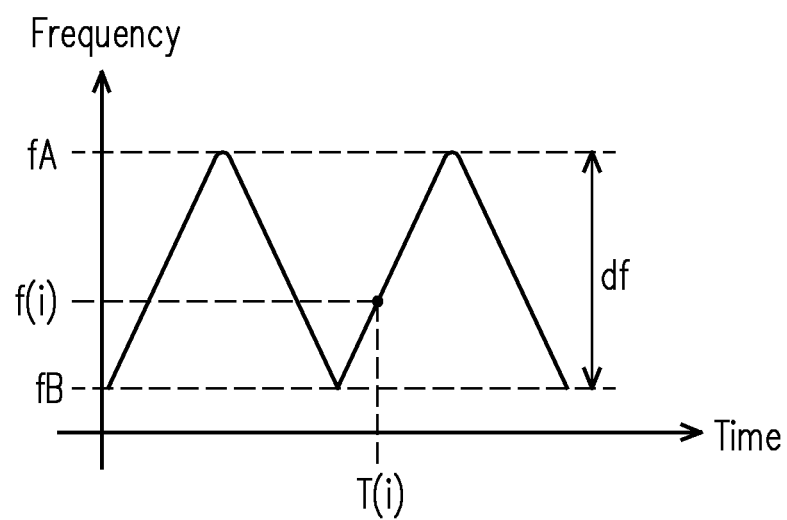
FIG. 3 is a schematic diagram illustrating a frequency variation of a spread spectrum clock signal according to an exemplary embodiment of the invention.

FIG. 2 is a schematic diagram illustrating a waveform of a control signal according to an exemplary embodiment of the invention. FIG. 3 is a schematic diagram illustrating a frequency variation of a spread spectrum clock signal according to an exemplary embodiment of the invention.

Referring to FIG. 2 and FIG. 3, taking the triangular wave as an example, at different time points, the voltage value of the control signal CS may be oscillated within a voltage range defined by an upper limit voltage VA and a lower limit voltage VB. In correspondence to a voltage variation of the control signal CS, the frequency of the spread spectrum clock signal CK may be varied within a frequency range defined by an upper limit frequency fA and a lower limit frequency fB. For example, a frequency difference between the upper limit frequency fA and the lower limit frequency fB may be denoted by df. Taking a time point T(i) as an example, in response to the voltage value of the control signal CS being V(i), the frequency of the spread spectrum clock signal CK may be f(i).

In an exemplary embodiment, the impedance value of the impedance component 12 may be used to control the frequency difference df. For example, the impedance value of the impedance component 12 may be negative correlated to the frequency difference df. That is, if the impedance value of the impedance component 12 is smaller, the frequency of the spread spectrum clock signal CK may be varied within a larger frequency variation range.

In an exemplary embodiment, the clock generation circuit 11 may include a voltage division circuit 112, an oscillation circuit 122, a current source 114 and a current source 124. The voltage division circuit 112 may be located at the impedance terminal 110 and coupled to the impedance component 12. The oscillation circuit 122 may be located at the oscillation terminal 120 and coupled to the voltage division circuit 112. Through the impedance component 12, the voltage division circuit 112 may generate the voltage V1 in response to the control signal SC. The oscillation circuit 122 may receive the voltage V1 and a voltage (a.k.a. a second voltage) V2 and compare the voltage V1 with the voltage V2 to generate the spread spectrum clock signal CK. It should be noted that, the voltage V1 is generated at the impedance terminal 110, and the voltage V2 is generated at the oscillation terminal 120, as shown in FIG. 1.

In an exemplary embodiment, the voltage division circuit 112 may perform a voltage division operation on the control signal CS flowing through the impedance component 12 to generate voltages (a.k.a. initial voltages) V0 and V1. For example, the voltage division circuit 112 may include impedance components R1 and R2. The impedance components R1 and R2 may provide the same or similar impedance values. The voltage V1 may be generated at an output terminal of the voltage division circuit 112.

In an exemplary embodiment, the oscillation circuit 122 may include a comparator 131, an oscillator 132 and a charging/discharging circuit 133. The comparator 131 is coupled to the voltage division circuit 112, the oscillator 132 and the charging/discharging circuit 133. The comparator 131 may receive the voltages V1 and V2. The comparator 131 may compare the voltages V1 and V2 and generate a comparison signal. The comparison signal may reflect a difference between the voltages V1 and V2. The oscillator 132 may generate the spread spectrum clock signal CK according to the comparison signal from the comparator 131. F or example, the oscillator 132 may include a voltage control oscillator or other type of oscillator.

In an exemplary embodiment, the oscillator 132 may adjust the frequency of the spread spectrum clock signal CK according to the comparison signal from the comparator 131. For example, the spread spectrum clock signal CK may have different frequencies depending on different voltage differences between the voltages V1 and V2.

In an exemplary embodiment, the charging/discharging circuit 133 may provide the voltage V2 to the comparator 131 according to the spread spectrum clock signal CK. For example, the charging/discharging circuit 133 may include a switch component 1331, a switch component 1332 and a capacitor C. The switch component 1331 and the switch component 1332 may be turned on or turned off according to the frequency of the spread spectrum clock signal CK to charge and discharge the capacitor C, respectively.

In an exemplary embodiment, the control circuit 13 may include a periodic signal generator or an oscillating signal generator to generate the control signal CS including the triangular wave or the sine wave. Taking the triangular wave as an example, the waveform of the control signal CS may be as shown in FIG. 2.

Figure 4:
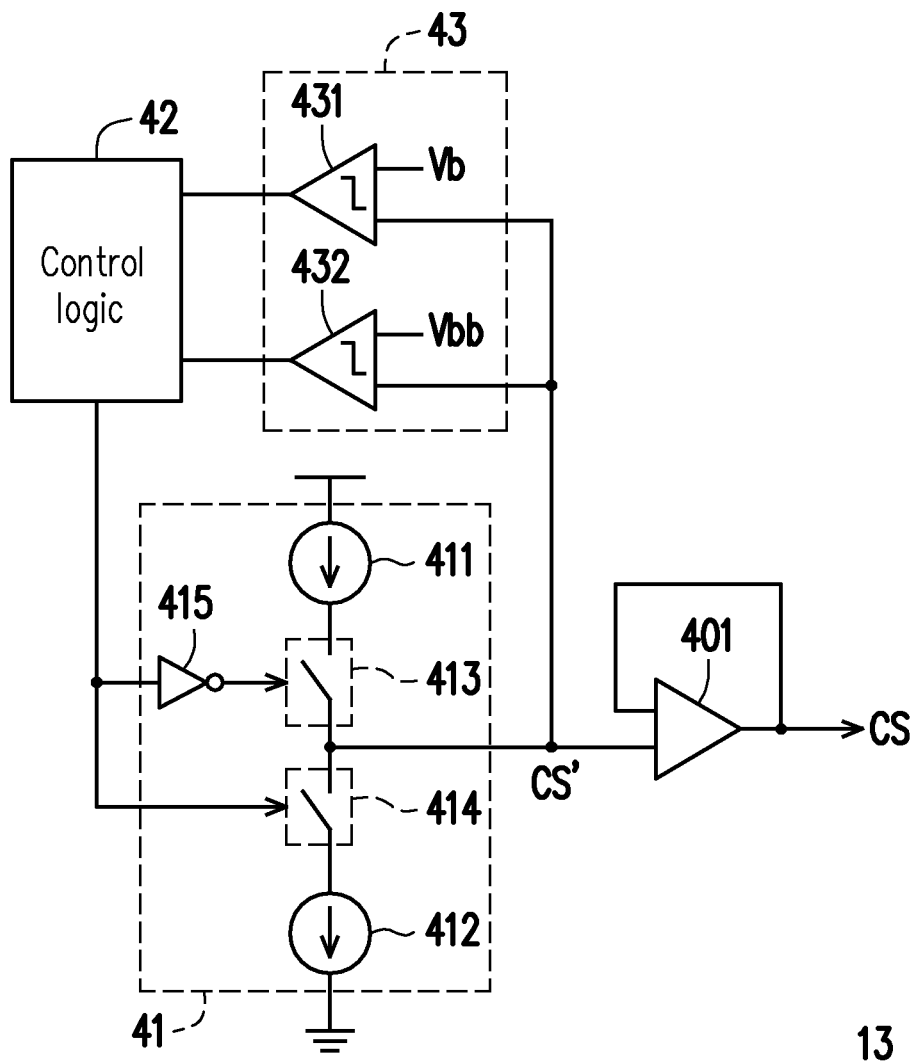
FIG. 4 is a schematic diagram illustrating a control circuit according to an exemplary embodiment of the disclosure.

FIG. 4 is a schematic diagram illustrating a control circuit according to an exemplary embodiment of the disclosure. Referring to FIG. 4, in an exemplary embodiment, the control circuit 13 includes a charging/discharging circuit 41, a control logic 42 and a comparison circuit 43. The control logic 42 is coupled to the charging/discharging circuit 41 and the comparison circuit 43. The control logic 42 may control the charging/discharging circuit 41 to generate a signal CS' according to a comparison result of the comparison circuit 43. The comparison circuit 43 may compare the signal CS' with signals Vb and Vbb (a.k.a. reference signals), respectively, and output the comparison result to the control logic 42.

In an exemplary embodiment, the charging/discharging circuit 41 may include a current source 411, a current source 412, a switch component 413, a switch component 414 and an inverting component 415. According to a control voltage from the control logic 42, the control voltage inverted by the inverting component 415 may be used to control the switch component 413 to turn on or cut off the current source 411, and the non-inverted control voltage may be used to control the switch component 414 to turn on or cut off the current source 412. In this way, the charging/discharging circuit 41 can output the signal CS'.

In an exemplary embodiment, the comparison circuit 43 may include comparators 431 and 432. The comparator 431 may be used to compare the signals Vb and CS' and generate an output according to a comparison result. The comparator 432 may be used to compare the signals Vbb and CS' and generate an output according to a comparison result. In an exemplary embodiment, the control logic 42 may control a voltage of the signal CS' to be less than a voltage of the signal Vb according to the comparison result of the signals Vb and CS'. For example, the voltage of the signal Vb may be the same as the upper limit voltage VA of FIG. 2. In an exemplary embodiment, the control logic 42 may control the voltage of the signal CS' to be greater than a voltage of the signal Vbb according to the comparison result of the signals Vbb and CS'. For example, the voltage of the signal Vbb may be the same as the lower limit voltage VB of FIG. 2. In an exemplary embodiment, a voltage value of the signal CS' may be oscillated within one predetermined voltage range according to the comparison results of the signal CS' with respect to Vb and Vbb, as shown in FIG. 2.

In an exemplary embodiment, the comparators 431 and 432 may each be a Schmitt trigger or other type of comparator having similar functionality. In another exemplary embodiment, the control circuit 13 may further include a buffer component 401. The signal CS' may pass through the buffer component 401 to become the control signal CS.

Figure 5:
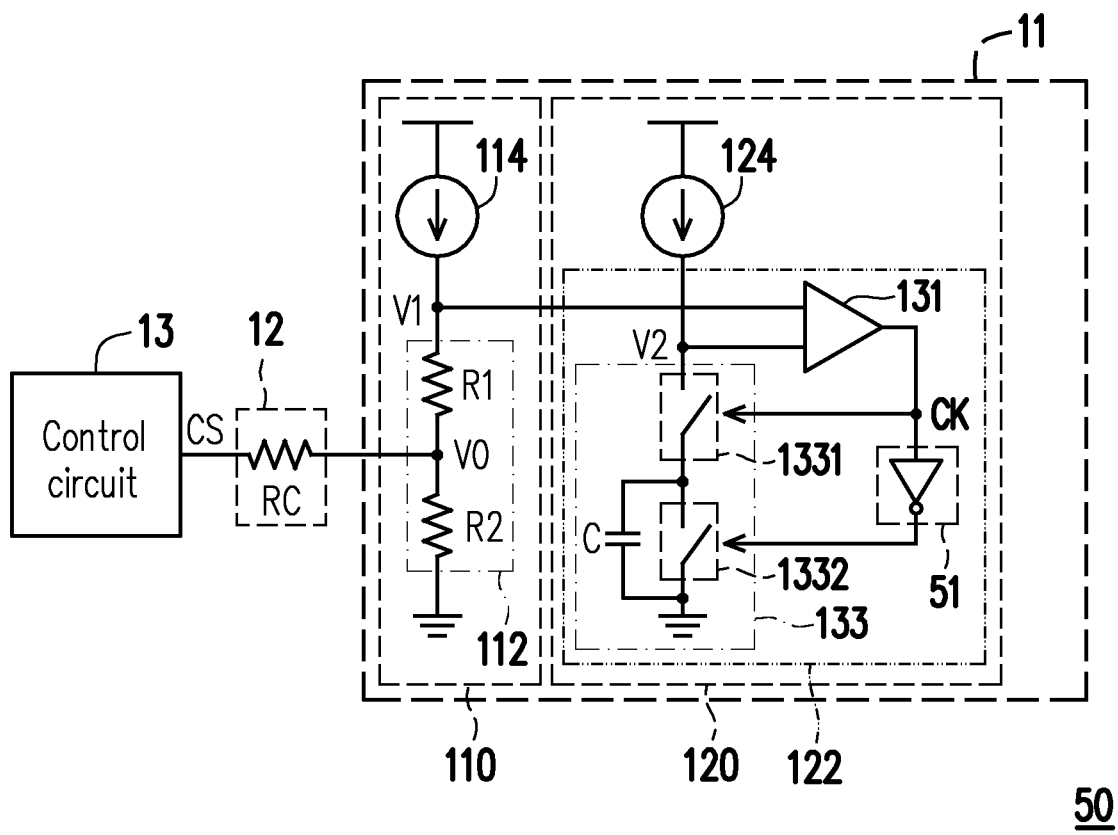
FIG. 5 is a schematic diagram illustrating a spread spectrum clock generator according to an exemplary embodiment of the invention.

FIG. 5 is a schematic diagram illustrating a spread spectrum clock generator according to an exemplary embodiment of the invention. Referring to FIG. 5, in comparison with the exemplary embodiment of FIG. 1, in a spread spectrum clock generator 50, the oscillator 132 in the spread spectrum clock generator 10 is replaced by an inverting component 51. In an exemplary embodiment, an output of the comparator 131 may be used as the spread spectrum clock signal CK. The non-inverted spread spectrum clock signal CK may be used to control the switch component 1331, and the inverted spread spectrum clock signal CK may be use to control the switch component 1332, so as to generate the voltage V2. In addition, the components of the same reference numerals in FIG. 5 can be referred to the description of the exemplary embodiment of FIG. 1, which is not repeated herein.

In an exemplary embodiment, the spread spectrum clock generator 10 of FIG. 1 or the spread spectrum clock generator 50 of FIG. 5 may be disposed in one memory storage device or one memory control circuit unit to cooperate with the memory storage device or the memory control circuit unit. Nonetheless, in an exemplary embodiment, the spread spectrum clock generator 10 of FIG. 1 or the spread spectrum clock generator 50 of FIG. 5 may also be disposed in other type of electronic device.

Figure 6:
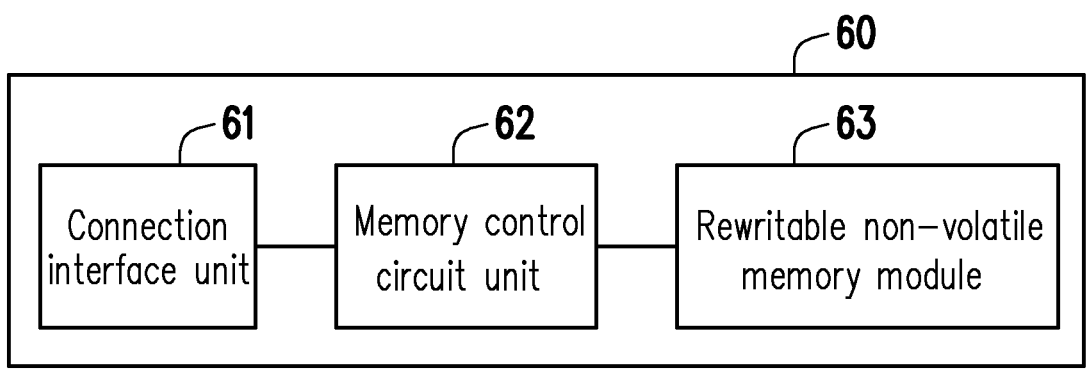
FIG. 6 is a schematic diagram illustrating a memory storage device according to an exemplary embodiment of the invention.

FIG. 6 is a schematic diagram illustrating a memory storage device according to an exemplary embodiment of the invention. Referring to FIG. 6, the memory storage device 60 may be used together with a host system so the host system may write data into the memory storage device 60 or read data from the memory storage device 60. For example, the mentioned host system may be any system capable of substantially cooperating with the memory storage device 60 for storing data, such as a desktop computer, a notebook computer, a digital camera, a video camera, a communication device, an audio player, a video player or a tablet computer.

The memory storage device 60 includes a connection interface unit 61, a memory control circuit unit 62 and a rewritable non-volatile memory module 63. The connection interface unit 61 is configured to connect the memory storage device 60 to the host system. In an exemplary embodiment, the connection interface unit 61 is compatible with a SATA (Serial Advanced Technology Attachment) standard. Nevertheless, it should be understood that the invention is not limited in this regard. The connection interface unit 61 may also be compatible with a PATA (Parallel Advanced Technology Attachment) standard, a PCI Express (Peripheral Component Interconnect Express) interface standard, a USB (Universal Serial Bus) standard or other suitable standards. The connection interface unit 61 may be packaged into one chip with the memory control circuit unit 62, or the connection interface unit 61 may also be distributed outside of a chip containing the memory control circuit unit 62.

The memory control circuit unit 62 is configured to perform operations of writing, reading or erasing data in the rewritable non-volatile memory module 63 according to the control commands. The rewritable non-volatile memory module 63 is coupled to the memory control circuit unit 62 and configured to store data written from the host system. The rewritable non-volatile memory module 63 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Qual Level Cell) NAND-type flash memory module (i.e., a flash memory module capable of storing four bits in one memory cell), other flash memory modules or other memory modules having the same features.

In the rewritable non-volatile memory module 63, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". By changing the threshold voltage, each of the memory cells in the rewritable non-volatile memory module 63 can have a plurality of storage states. The storage state to which the memory cell belongs may be determined by applying a read voltage to the memory cell, so as to obtain the one or more bits stored in the memory cell.

In this exemplary embodiment, the memory cells of the rewritable non-volatile memory module 63 may constitute a plurality of physical programming units, and the physical programming units can constitute a plurality of physical erasing units. Specifically, the memory cells on the same word line may constitute one or more of the physical programming units. If each of the memory cells can store two or more bits, the physical programming units on the same word line may be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In this exemplary embodiment, the physical programming unit is the minimum unit for programming. That is, the physical programming unit is the minimum unit for writing data. For example, the physical programming unit may be a physical page or a physical sector. If the physical programming unit is the physical page, these physical programming units may include a data bit area and a redundancy bit area. The data bit area contains multiple physical sectors configured to store user data, and the redundant bit area is configured to store system data (e.g., management data such as an error correcting code, etc.). In this exemplary embodiment, the data bit area contains 32 physical sectors, and a size of each physical sector is 512 bytes (B). However, in other exemplary embodiments, the data bit area may also contain 8, 16 physical sectors or different number (more or less) of the physical sectors, and the size of each physical sector may also be greater or smaller. On the other hand, the physical erasing unit is the minimum unit for erasing. That is, each physical erasing unit contains the least number of memory cells to be erased together. For instance, the physical erasing unit is a physical block.

In an exemplary embodiment, the rewritable non-volatile memory module 63 of FIG. 6 is also known as a flash memory module. In an exemplary embodiment, the memory control circuit unit 62 of FIG. 6 is also known as a flash memory controller for controlling the flash memory module. In an exemplary embodiment, the spread spectrum clock generator 10 of FIG. 1 or the spread spectrum clock generator 50 of FIG. 5 may be disposed in the connection interface unit 61, the memory control circuit unit 62 or the rewritable non-volatile memory module 63 of FIG. 6 to provide the spread spectrum clock signal CK required for device operations.

It should be noted that the circuit structures illustrated in FIG. 1, FIG. 4 and FIG. 5 are merely examples and are not intended to limit the invention. In another exemplary embodiment, coupling relationships between the electronic components in the circuit structures illustrated in FIG. 1, FIG. 4 and FIG. 5 may be adjusted according to practical requirements. In another exemplary embodiment, the electronic components in the circuit structures illustrated in FIG. 1, FIG. 4, and FIG. 5 may also be replaced by electronic components having the same or similar functions. In addition, other types of electronic components may be included in the circuit structures illustrated in FIG. 1, FIG. 4, and FIG. 5 to provide other additional functions, which are not limited by the invention.

Figure 7:
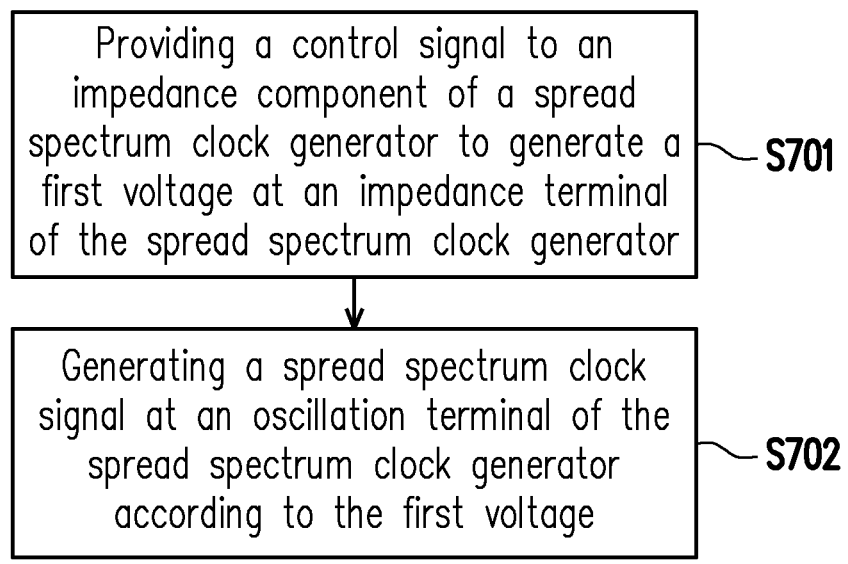
FIG. 7 is a flowchart illustrating a signal generation method according to an exemplary embodiment of the invention.

FIG. 7 is a flowchart illustrating a signal generation method according to an exemplary embodiment of the invention. Referring to FIG. 7, in step S701, a control signal is provided to an impedance component of a spread spectrum clock generator to generate a first voltage at an impedance terminal of the spread spectrum clock generator. In step S702, a spread spectrum clock signal is generated at an oscillation terminal of the spread spectrum clock generator according to the first voltage.

Nevertheless, steps depicted in FIG. 7 are described in detail as above so that related description thereof is omitted hereinafter. It should be noted that, the steps depicted in FIG. 7 may be implemented as a plurality of program codes or circuits, which are not particularly limited in the invention. Moreover, the method disclosed in FIG. 7 may be implemented by reference with above exemplary embodiments, or may be implemented separately, which are not particularly limited in the invention.

In summary, the spread spectrum clock generator provided by the exemplary embodiments of the invention excludes the PLL circuit and can generate a stable spread spectrum clock signal. Compared with the conventional spread spectrum clock generator including the PLL circuit, in an exemplary embodiment, the spread spectrum clock generator excluding the PLL circuit is less space-consuming in circuit layout and has less complicated circuit design and/or lower power consumption during operation.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A spread spectrum clock generator, comprising:
a clock generation circuit;
an impedance component coupled to an impedance terminal of the clock generation circuit; and
a control circuit coupled to the impedance component,
wherein the control circuit is configured to provide a control signal to the impedance component to generate a first voltage at the impedance terminal, and
the clock generation circuit is configured to generate a spread spectrum clock signal at an oscillation terminal of the clock generation circuit according to a difference between the first voltage and a second voltage, wherein the second voltage is generated by a feedback of the spread spectrum clock signal.

2. The spread spectrum clock generator according to claim 1, wherein the spread spectrum clock generator excludes a phase-locked loops circuit.

3. The spread spectrum clock generator according to claim 1, wherein an impedance value of the impedance component affects a frequency variation range of the spread spectrum clock signal.

4. The spread spectrum clock generator according to claim 1, wherein a voltage value of the control signal affects a frequency variation amount of the spread spectrum clock signal.

5. The spread spectrum clock generator according to claim 1, wherein the clock generation circuit comprises:
a voltage division circuit located at the impedance terminal and coupled to the impedance component; and
an oscillation circuit located at the oscillation terminal and coupled to the voltage division circuit,
wherein the voltage division circuit is configured to generate the first voltages in response to the control signal, and
the oscillation circuit is configured to generate the spread spectrum clock signal by comparing the first voltage with the second voltage.

6. The spread spectrum clock generator according to claim 5, wherein the oscillation circuit comprises:
a comparator coupled to the voltage division circuit and configured to compare the first voltage with the second voltage and generate a comparison signal; and
an oscillator coupled to the comparator and configured to generate the spread spectrum clock signal according to the comparison signal.

7. The spread spectrum clock generator according to claim 6, wherein the oscillator is further configured to adjust a frequency of the spread spectrum clock signal according to the comparison signal.

8. The spread spectrum clock generator according to claim 5, wherein the clock generation circuit further comprises:
a charging/discharging circuit coupled to the oscillation circuit and configured to provide the second voltage according to the spread spectrum clock signal.

9. The spread spectrum clock generator according to claim 1, wherein a voltage of the control signal is oscillated within a predetermined voltage range.

10. The spread spectrum clock generator according to claim 9, wherein the control circuit comprises:
a charging/discharging circuit;
a control logic coupled to the charging/discharging circuit; and
a comparison circuit coupled to the control logic,
wherein the comparison circuit is configured to compare the control signal with a plurality of reference signals, and
the control logic controls the charging/discharging circuit to generate the control signal according to a comparison result.

11. A memory storage device, comprising:
a connection interface unit, configured to couple to a host system;
a rewritable non-volatile memory module; and
a memory control circuit unit, coupled to the connection interface unit and the rewritable non-volatile memory module,
wherein the memory control circuit unit comprises a spread spectrum clock generator,
the spread spectrum clock generator is configured to provide a control signal to an impedance component to generate a first voltage at an impedance terminal of the spread spectrum clock generator,
the impedance component is coupled to the impedance terminal, and
the spread spectrum clock generator is further configured to generate a spread spectrum clock signal at an oscillation terminal of the spread spectrum clock generator according to a difference between the first voltage and a second voltage, wherein the second voltage is generated by a feedback of the spread spectrum clock signal.

12. The memory storage device according to claim 11, wherein the spread spectrum clock generator excludes a phase-locked loops circuit.

13. The memory storage device according to claim 11, wherein an impedance value of the impedance component affects a frequency variation range of the spread spectrum clock signal.

14. The memory storage device according to claim 11, wherein a voltage value of the control signal affects a frequency variation amount of the spread spectrum clock signal.

15. The memory storage device according to claim 11, wherein the spread spectrum clock generator comprises:
a voltage division circuit located at the impedance terminal and coupled to the impedance component; and
an oscillation circuit located at the oscillation terminal and coupled to the voltage division circuit,
wherein the voltage division circuit is configured to generate the first voltages in response to the control signal, and
the oscillation circuit is configured to generate the spread spectrum clock signal by comparing the first voltage with the second voltage.

16. The memory storage device according to claim 15, wherein the oscillation circuit comprises:
a comparator coupled to the voltage division circuit and configured to compare the first voltage with the second voltage and generate a comparison signal; and
an oscillator coupled to the comparator and configured to generate the spread spectrum clock signal according to the comparison signal.

17. The memory storage device according to claim 16, wherein the oscillator is further configured to adjust a frequency of the spread spectrum clock signal according to the comparison signal.

18. The memory storage device according to claim 15, wherein the spread spectrum clock generator further comprises:
a charging/discharging circuit coupled to the oscillation circuit and configured to provide the second voltage according to the spread spectrum clock signal.

19. The memory storage device according to claim 11, wherein a voltage of the control signal is oscillated within a predetermined voltage range.

20. The memory storage device according to claim 19, wherein the spread spectrum clock generator comprises:
a charging/discharging circuit;
a control logic coupled to the charging/discharging circuit; and
a comparison circuit coupled to the control logic,
wherein the comparison circuit is configured to compare the control signal with a plurality of reference signals, and
the control logic controls the charging/discharging circuit to generate the control signal according to a comparison result.

21. A signal generation method for a memory storage device, the signal generation method comprising:
provided a control signal to an impedance component to generate a first voltage at an impedance terminal of a spread spectrum clock generator in the memory storage device, wherein the impedance component is coupled to the impedance terminal; and
generating a spread spectrum clock signal at an oscillation terminal of the spread spectrum clock generator according to a difference between the first voltage and a second voltage, wherein the second voltage is generated by a feedback of the spread spectrum clock signal.

22. The signal generation method according to claim 21, wherein the spread spectrum clock generator excludes a phase-locked loops circuit.

23. The signal generation method according to claim 21, wherein an impedance value of the impedance component affects a frequency variation range of the spread spectrum clock signal.

24. The signal generation method according to claim 21, wherein a voltage value of the control signal affects a frequency variation amount of the spread spectrum clock signal.

25. The signal generation method according to claim 21, wherein the step of generating the spread spectrum clock signal at the oscillation terminal of the spread spectrum clock generator according to the first voltage comprises:
generating the first voltage in response to the control signal; and
generating the spread spectrum clock signal by comparing the first voltage with the second voltage.

26. The signal generation method according to claim 25, wherein the step of generating the spread spectrum clock signal by comparing the first voltage with the second voltage of the oscillation terminal comprises:
comparing the first voltage with the second voltage and generating a comparison signal; and
generating the spread spectrum clock signal according to the comparison signal.

27. The signal generation method according to claim 26, further comprising:
adjusting a frequency of the spread spectrum clock signal according to the comparison signal.

28. The signal generation method according to claim 25, further comprising:
providing the second voltage according to the spread spectrum clock signal.

29. The signal generation method according to claim 21, wherein a voltage of the control signal is oscillated within a predetermined voltage range.

30. The signal generation method according to claim 29, further comprising:
comparing the control signal with a plurality of reference signals; and
controlling a charging/discharging circuit to generate the control signal according to a comparison result.

* * * * *